United States Patent
Godzaridis et al.

(10) Patent No.: US 10,930,073 B1
(45) Date of Patent: Feb. 23, 2021

(54) MULTI-RESOLUTION SURFACE CLIPPING WITH ASYNCHRONOUS INCREMENTAL ON-DEMAND MARKING OF SPATIAL INDEX NODES

(71) Applicant: Bentley Systems, Incorporated, Exton, PA (US)

(72) Inventors: Elenie Godzaridis, Quebec (CA); Mathieu St-Pierre, Ste-Brigitte de Laval (CA)

(73) Assignee: Bentley Systems, Incorporated, Exton, PA (US)

(*) Notice: Subject to any disclaimer, the term of this patent is extended or adjusted under 35 U.S.C. 154(b) by 0 days.

(21) Appl. No.: 16/680,034

(22) Filed: Nov. 11, 2019

Related U.S. Application Data

(60) Provisional application No. 62/909,042, filed on Oct. 1, 2019.

(51) Int. Cl.
    *G06T 17/20*    (2006.01)
    *G06T 15/30*    (2011.01)
    *G06T 17/00*    (2006.01)
    *G06F 30/23*    (2020.01)

(52) U.S. Cl.
    CPC ............ *G06T 17/205* (2013.01); *G06F 30/23* (2020.01); *G06T 15/30* (2013.01); *G06T 17/005* (2013.01)

(58) Field of Classification Search
    CPC ..... G06T 17/205; G06T 15/30; G06T 17/005; G06F 30/23
    See application file for complete search history.

(56) References Cited

U.S. PATENT DOCUMENTS

| | | | |
|---|---|---|---|
| 8,554,475 B2 | 10/2013 | Doucette et al. | |
| 10,013,810 B2 | 7/2018 | Waschbusch et al. | |
| 10,255,720 B1* | 4/2019 | Godzaridis | G06T 17/20 |
| 2006/0290695 A1* | 12/2006 | Salomie | G06T 17/20 |
| | | | 345/420 |
| 2016/0093110 A1 | 3/2016 | Waschbusch et al. | |

FOREIGN PATENT DOCUMENTS

CN    104331928 B    10/2017

OTHER PUBLICATIONS

"3DReshaper Beginners Guide," 3DReshaper Help, Technodigit, Jul. 2, 2018, pp. 1-175.

(Continued)

*Primary Examiner* — Chong Wu
(74) *Attorney, Agent, or Firm* — Cesari and McKenna, LLP; James A. Blanchette

(57) ABSTRACT

In various embodiments, techniques are provided for clipping and displaying a multi-resolution textured mesh using asynchronous incremental on-demand marking of spatial index nodes to allow for substantially real-time display refresh after a change is made to clip geometry. Timestamps may be added to spatial index nodes and an upper bound placed on the number of operations performed such that an index in an intermediate (unfinished) state may be produced. Further, operations may be focused on tiles required for display and not simply all tiles affected by the change to the clip geometry. A display process may use the spatial index in the intermediate (unfinished) state to produce a substantially real-time display, without waiting for all operations to complete.

20 Claims, 7 Drawing Sheets

(56) References Cited

OTHER PUBLICATIONS

"Bentley Descartes Help: Scalable Terrain Model," Jun. 15, 2019, pp. 1-34.
"Bentley Terrain Model," Oct. 2, 2018, pp. 1-41.
"Creating Contours Using Global Mapper," Apr. 27, 2016, pp. 1-8.
"Global Mapper User's Manual," Mar. 9, 2010, pp. 1-325.
"How to Generate Contours in ArcGIS for Desktop," Maryland Information Technology, MD DoIT GIO, Jan. 9, 2019, pp. 1-13.
"How to Generate the Contour Lines," Pix4D, Pix4D Documentation, <https://support.pix4d.com/hc/en-us/articles/202560639-How-to-generate-the-contour-lines>, Dec. 14, 2018, pp. 1-3.

\* cited by examiner

MULTI-RESOLUTION SURFACE CLIPPING WITH ASYNCHRONOUS INCREMENTAL ON-DEMAND MARKING OF SPATIAL INDEX NODES

RELATED APPLICATIONS

The present application claims the benefit of U.S. Provisional Patent Application No. 62/909,042, filed on Oct. 1, 2019, entitled MULTI-RESOLUTION SURFACE CLIPPING WITH ASYNCHRONOUS INCREMENTAL ON-DEMAND MARKING OF SPATIAL INDEX NODES, the contents of which are incorporated by reference herein in their entirety.

BACKGROUND

Technical Field

The present disclosure relates generally to computer software and hardware that utilize meshes, and more specifically to techniques for clipping and displaying a multi-resolution textured mesh.

Background Information

A number of types of software applications may generate a multi-dimensional mesh (e.g., a two-dimension (2-D), two-and-a-half-dimension (2.5-D), three-dimension (3-D), four-dimension (4-D), etc. mesh) that represents a portion of the physical environment (e.g., structures, terrain, one or more objects, etc. in the real world). Such a multi-dimensional mesh (hereinafter referred to simply as a "mesh") may be a multi-resolution textured mesh, which includes multiple levels of detail (LOD). One type of software application that may generate a multi-resolution textured mesh is a structure from motion (SfM) photogrammetry application, such as the ContextCapture™ application available from Bentley Systems, Inc. A SfM photogrammetry application may operate to generate a multi-resolution textured mesh composed of faces (e.g., triangles) formed from vertices connected by edges. The multi-resolution mesh may be generated based on a set of images (e.g., photographs), point clouds or other representations of the real-world captured by one or more cameras, scanners, etc.

After a multi-resolution textured mesh has been generated, it may be displayed in a graphical user interface (GUI) of an application, for example, an editing, visualization and analysis application. While it is often useful simply to display the multi-resolution textured mesh, further utility may be gained by combining it with computer-generated elements (e.g., computer aided design (CAD) objects) to create a combined display. Among other uses, the CAD objects may represent planned infrastructure (e.g., roads, bridges, pipelines, buildings, or other man-made structures), and the combined display may allow a user to visualize the CAD objects in the context of the physical environment shown by the mesh, and make design adjustments. In order to combine CAD objects with a multi-resolution textured mesh, it is typically necessary to clip the mesh where the CAD objects are to be added, so that the mesh does not visually interfere with the objects.

While there are a number of existing clipping algorithms that may be adapted for this task, they suffer various shortcomings. Many existing algorithms require substantial processing and memory resources to handle large clip regions, on very large meshes, with many levels of detail. Operations typically have been performed recursively and in synchronization on a spatial index organizing the mesh. As a result, it could take several minutes for clipping to be applied and the display to refresh after a change is made to the geometry of a CAD object and thereby the geometry of a clip region. During this time, the user was typically prevented from making further changes, and instead had to wait for the clipping to complete and the display to refresh. This lack of responsiveness hindered iterative refinements and overall usability of applications, such as editing, visualization and analysis applications.

There is a need for improved techniques for clipping and displaying a multi-resolution textured mesh that may enable substantially real-time display refresh after a change is made to clip geometry, even in the case of large clip regions, on very large meshes, that have many levels of detail.

SUMMARY

In various embodiments, techniques are provided for clipping and displaying a multi-resolution textured mesh using asynchronous incremental on-demand marking of spatial index nodes to allow for substantially real-time display refresh. Timestamps may be added to spatial index nodes and an upper bound placed on the number of operations performed, such that a spatial index in an intermediate (unfinished) state is produced. A display process may use the spatial index in the intermediate (unfinished) state to produce a substantially real-time display, without waiting for all operations to complete. If a user makes a further change before all operations are complete, the older changes may expire naturally, and the new changes may be computed instead. As a result of these properties, substantially real-time refresh may still be provided even with large clip regions, very large meshes, and many levels of detail.

In one specific embodiment, an application may update a spatial index for a multi-resolution mesh to an intermediate state of clipping, the spatial having a plurality of nodes arranged in a tree corresponding to tiles of the multi-resolution mesh. The intermediate state includes one or more nodes processed to include a tag describing how changed clip geometry applies to the node's corresponding tile, and one or more nodes yet to be processed for the changed clip geometry. Nodes are each given a timestamp that reflects when its tag was updated with clip geometry. The application displays the multi-resolution mesh by selecting nodes, and for each selected node, determining whether an ancestor node includes a tag describing clip geometry not found in a tag of the selected node and has a timestamp older than the ancestor node. If so, the application dispatches the selected node to be processed based on the clip geometry not found in the tag and temporarily displays a lower resolution tile corresponding to the ancestor node. If not, the application displays the tile corresponding to the selected node.

It should be understood that a variety of additional features and alternative embodiments may be implemented other than those discussed in this Summary. This Summary is intended simply as a brief introduction to the reader for the further description that follows, and does not indicate or imply that the examples mentioned herein cover all aspects of the disclosure, or are necessary or essential aspects of the disclosure.

BRIEF DESCRIPTION OF THE DRAWINGS

The description refers to the accompanying drawings of example embodiments, of which.

DETAILED DESCRIPTION

Figure 1:
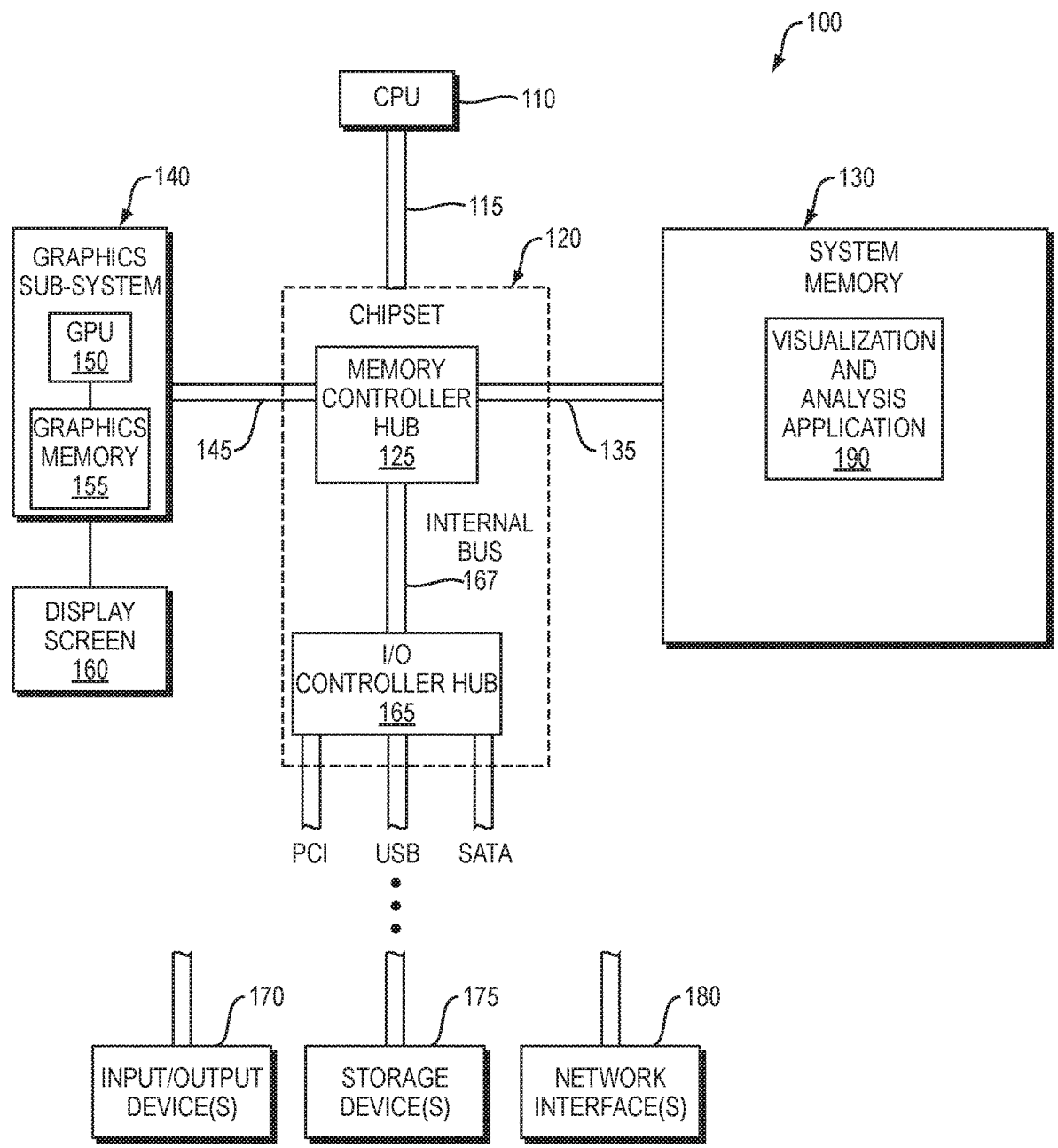
FIG. 1 is a block diagram of an example electronic device (e.g., a computing device) that may be used with the present techniques.

FIG. 1 is a block diagram of an example electronic device 100 (e.g., a computing device) that may be used with the present techniques. The electronic device includes a central processing unit (CPU) 110 that may be coupled to a chipset 120 by a front side bus 115. The chipset 120 includes a memory controller hub 125 that is responsible for communications with high-speed devices such as system memory 130 and a graphics subsystem (e.g., a graphics card) 140. The memory controller hub 125 is coupled to the system memory 130 by a high-speed memory bus 135. The system memory 130 is typically volatile memory, such as a Random Access Memory (RAM), which is adapted to store a wide range of software and data being actively used by the CPU 110. The memory controller hub 125 is coupled to a graphics subsystem 140 (e.g., a graphics card) by a high-speed graphics bus 145. The graphics subsystem 140 includes a GPU 150 and graphics memory 155, among other components. The graphics subsystem 140 is coupled to at least one display screen 160.

The chipset 120 further includes an input/output controller hub 165 coupled to the memory controller hub by an internal bus 167. Among other functions, the input/output controller hub 165 may support a variety of types of peripheral buses, such as a peripheral component interconnect (PCI) bus, a universal serial bus (USB) bus, and/or a Serial Advanced Technology Attachment (SATA) bus, for connecting to other system components. The system components may include one or more I/O devices 170, such as a keyboard, a mouse, a removable media drive, etc., one or more persistent storage devices 175, such as a hard disk drive, a solid-state drive, or another type of persistent data store, one or more network interfaces 180, such as an Ethernet interface or a Wi-Fi adaptor, among other system components. The network interface(s) 180 may allow communication with other electronic devices over a computer network, such as the Internet, to enable various types of collaborative, distributed, or remote computing.

Working together, the components of the electronic device 100 (and other electronic devices in the case of collaborative, distributed, or remote computing) may execute a number of different types of software that utilize various sources of data (e.g., files) persistently stored in storage devices 175 and loaded into memory 130 when needed. For example, software of an editing, visualization and analysis application 190, such the OpenRoad ConceptStation™ application available from Bentley Systems, Incorporated, may be loaded into memory and executed by the components of the electronic device. The editing, visualization and analysis application 190 may include a number of software processes, including a display process that operates to display a clipped multi-resolution textured mesh in a GUI on the display screen 160. Clipping may be performed for a number of reasons, including to accommodate CAD objects that are being combined with the mesh, for example, CAD objects that represent planned infrastructure (e.g., roads, bridges, pipelines, buildings, or other man-made structures) being combined with a mesh that represents the physical environment. The editing, visualization and analysis application 190 may also utilize a number of data repositories and data structures, including a local cache and one or more spatial indexes, which may be maintained in memory 130 and/or graphics memory 155.

Figure 2:
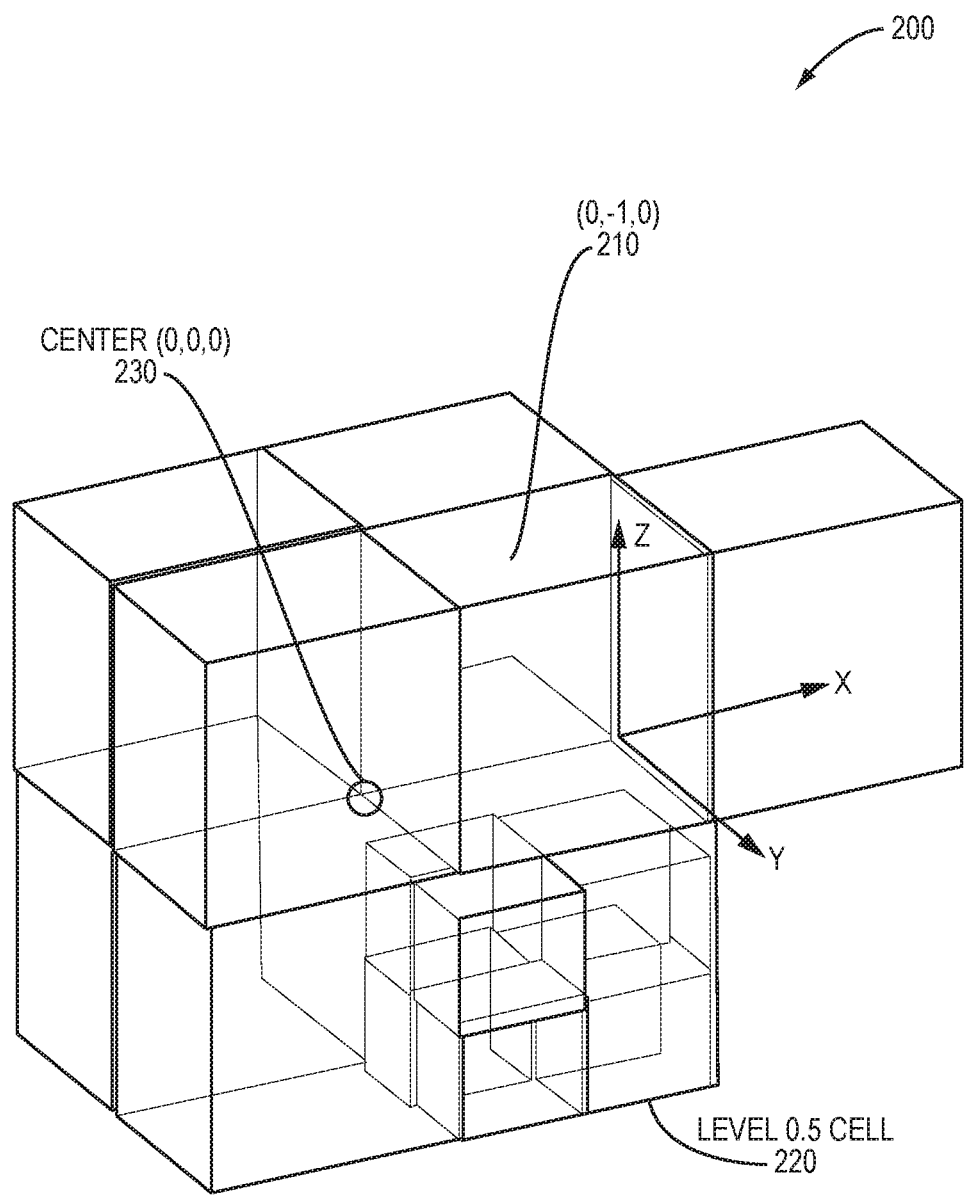
FIG. 2 is a diagram illustrating the use of tiles arranged in an octree.

The multi-resolution textured mesh displayed by the editing, visualization and analysis application 190 may be organized into tiles arranged in an octree, quadtree, or another spatial partition. FIG. 2 is a diagram 200 illustrating the use of tiles arranged in an octree. Each tile represents a region (e.g., in the case of a 3D mesh depicted here, a cubic region) in multi-dimensional space (e.g., in the case here, a 3D space) and is addressed by coordinates that represent an address of the tile. A parameter (I) may be associated with the tile to represent a level of the octree at which the tile is located. At each level below the highest level, tiles may be smaller (e.g., half the size in each dimension) than the tile immediately above, but represent the mesh at a higher resolution. For example, a tile 210 may have a level 1. A tile 220 at level 2 may be half the size in each dimension as tile 210, but represent space at a higher resolution. The center of the octree may be located at the bottom corner of the tile 230 on level 1. An encompassing tile at a level immediately above another tile in the octree may be referred to as a parent tile of such tile. Parent tiles and encompassing tiles at levels further above another tile may be referred to as an ancestor tile of such tile. An included tile at a level immediately below another tile in the octree may be referred to as a child tile. An independent tile at the same level as another tile that shares a parent may be referred to as a sibling tile.

Figure 3:
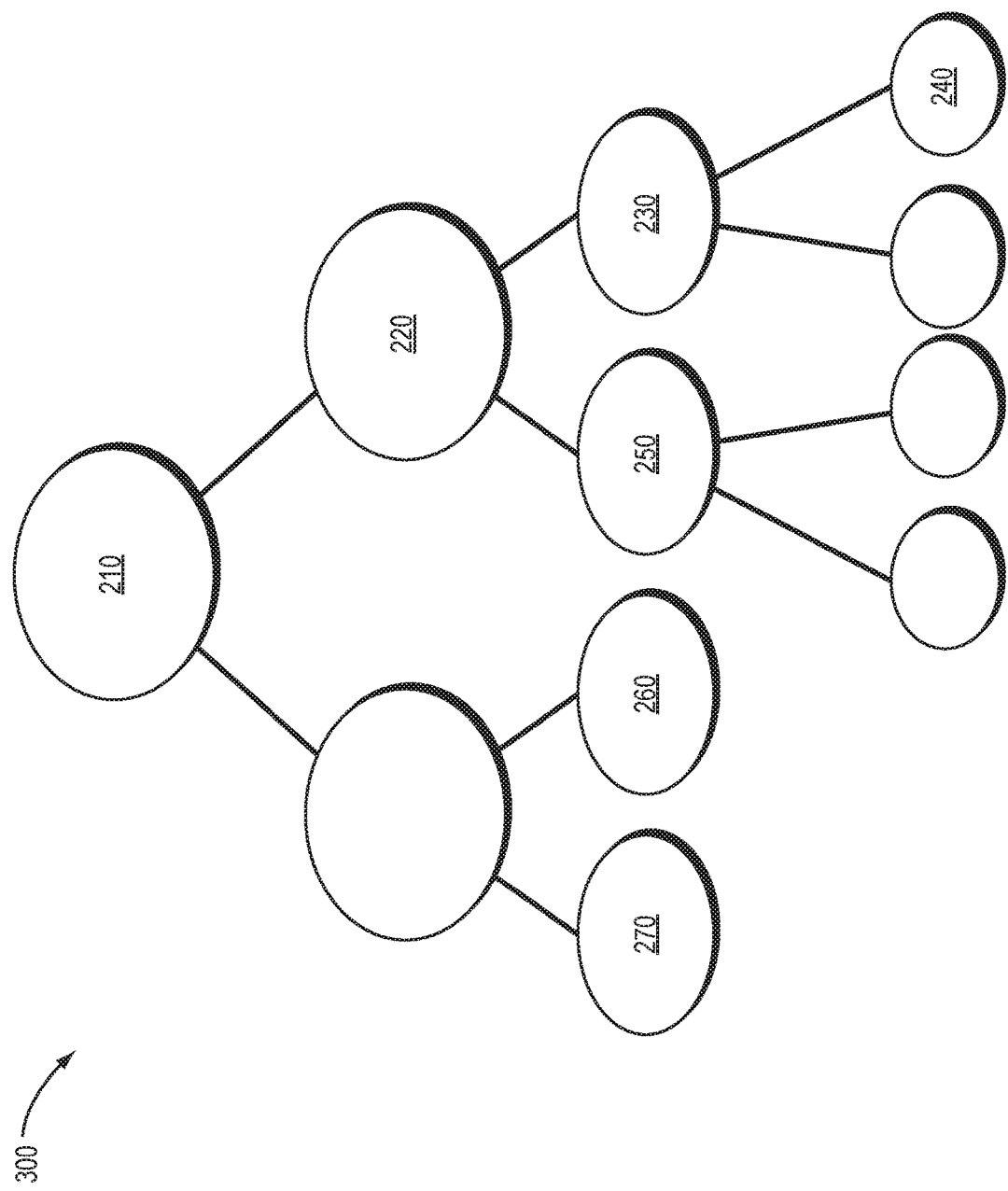
FIG. 3 is a diagram of an example spatial index, where each node includes metadata describing a corresponding tile.

The arrangement of tiles in FIG. 2 may be described in a spatial index that includes metadata describing each of the tiles and their relationships. Hierarchical spatial indexes of different types may be used, such as quadtrees, octrees, ambient octrees, binary partitions, or any combination thereof. FIG. 3 is a diagram 300 of an example spatial index, where each node includes metadata describing a corresponding tile. Just like tiles, the spatial index is organized into levels in a tree. A node 310 at the highest level may be referred to as the root node 310. Nodes at a lowest level may be referred to as leaf nodes 340. A connected node at a level immediately above another node may be referred to as a parent node of such node. For example, node 330 may be considered a parent node of node 340. Parent nodes and connected nodes at levels further above may be referred to as an ancestor node of such node. For example, nodes 310, 320 and 330 may be considered ancestor nodes of node 340. A connected node at a level immediately below another node may be referred to as a child node of such node. For example, node 340 may be considered a child node of node 330. An independent node at the same level as another node that shares the same parent may be referred to as a sibling node of such node. For example, node 350 may be considered a sibling node of node 330, and nodes 360 and 370 may be considered siblings of each other.

Figure 4:
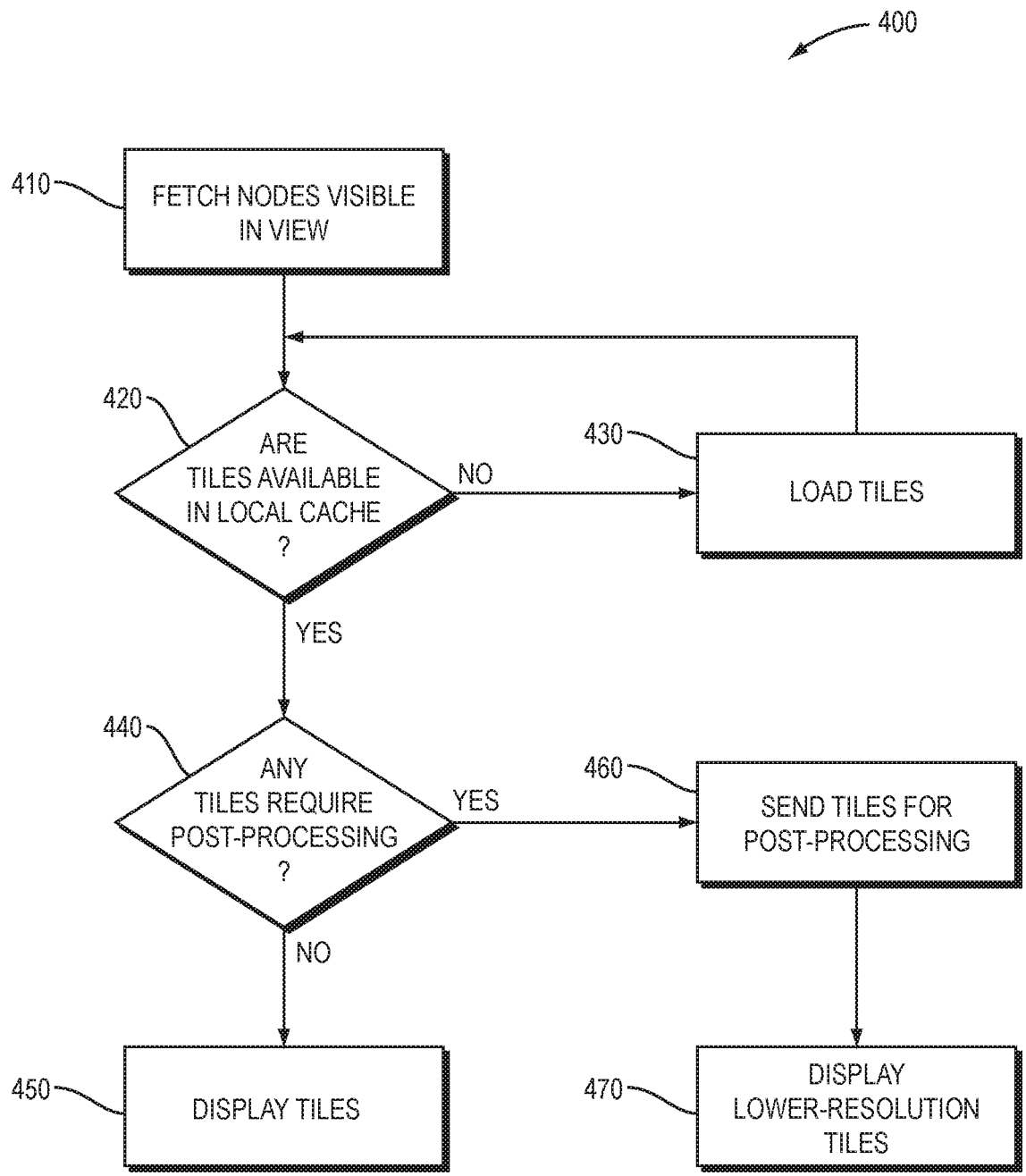
FIG. 4 is a flow diagram of a high-level sequence of steps for displaying a view of a multiresolution textured mesh.

Using the metadata in the spatial index, the editing, visualization and analysis application 190 may access tiles required to display a view of the multi-resolution textured mesh in a GUI on the display screen 160. FIG. 4 is a flow diagram of a high-level sequence of steps 400 for displaying a view of a multiresolution textured mesh. At step 410, the editing, visualization and analysis application 190 fetches nodes of the spatial index that describe the portion of the mesh visible in the view, and determines which tiles are required for a given resolution. At step 420, the application 190 determines whether the required tiles are already available in the local cache maintained in memory 130 and/or graphics memory 155. At step 430, for any tiles not available in the local cache, the application 190 loads the tiles asynchronously from a persistent storage device 175 (e.g., disk). At step 440, the application 190 determines any of the tiles that require post-processing before display. One type of post-processing that may be required is clipping based on a clip geometry, for example, defined by where CAD objects are to be added to the view. Data describing how the clip geometry applies to tiles typically is computed when the clip geometry is first defined, and stored in the nodes of the spatial index. If no post-processing is required for some tiles, those tiles are displayed, at step 450. If post-processing is required for some tiles, then the tiles are sent for post-processing at step 460. While post-processing is being performed on tiles, at step 470, portions of lower resolution tiles that are available in the local cache may be displayed in their place. When the post-processing eventually completes, the display is updated to show the tiles at the given resolution.

When clip geometry is changed, for example, due to a change in the CAD objects to be added, data in the spatial index describing how the clip geometry applies to tiles typically has to be recomputed. In a traditional approach, data for all nodes of the spatial index that correspond to tiles affected by the change is invalidated and recomputed, regardless of whether the tiles are required for rendering the current view. Such re-computation is typically fully completed before the display is refreshed and before a user is allowed to make further changes that would alter the clip geometry. In some cases, with large clip regions, on very large meshes, that have many levels of detail, this may take several minutes.

An improvement may be made over the traditional approach that integrates asynchronous incremental on-demand marking of spatial index nodes. Timestamps may be added to spatial index nodes and an upper bound placed on the number of operations performed. Further, operations may be focused on tiles required for display and not simply all tiles affected by the change to the clip geometry. A display process may use the spatial index in an intermediate (unfinished) state to produce a substantially real-time display, without waiting for all operations to complete. If a user makes a further change before all operations are complete, the older changes may expire naturally, and the new changes may be used instead.

Figure 5:
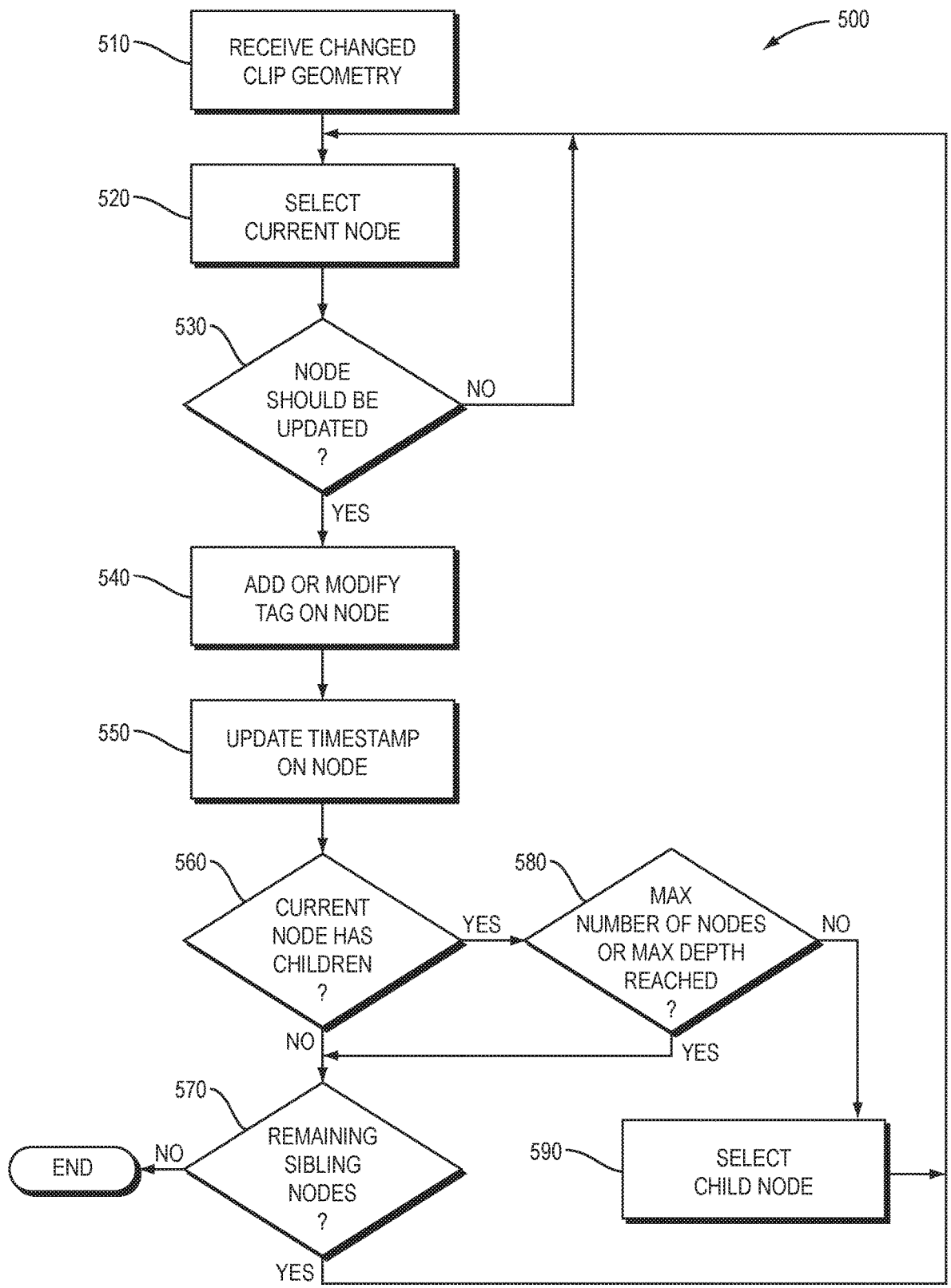
FIG. 5 is a flow diagram of a sequence of steps for an improved technique for updating a spatial index, to permit substantially real-time refresh.

FIG. 5 is a flow diagram of a sequence of steps 500 for an improved technique for updating a spatial index, to permit substantially real-time refresh. At step 510, a changed clip geometry is received that includes new or modified clip geometry, for example, in response to changes to CAD objects to be added to the view. At step 520, the editing, visualization and analysis application 190 selects a current node of the spatial index. On a first iteration of the step 520, the root node of the spatial index may be selected as the current node. At step 530, the application 190 determines whether the current node should be updated. If not, execution loops back to step 520 and a subsequent iteration is performed with a new current node, which may be a sibling node. If so, at step 540, the application 190 determines how the clip geometry applies to the current node's corresponding tile, and updates the current node to add or modify a tag describing how the clip geometry applies. Further, at step 550, the application 190 updates a timestamp of the current node that indicates a time at which the determination was made. The timestamp serves to version the clip geometry applied. Then, at step 560, the application 190 determines whether the current node has any child nodes. If the current node does not have at least one child node, execution proceeds to step 570, where a determination is made whether there are remaining sibling nodes to process. If so, execution loops back to step 520 and a sibling node is selected as the new current node. If not, execution ends. Returning to step 560, if the current node has at least one child node, execution proceeds to step 580, where the application 190 determines if a predetermined maximum number of nodes or maximum depth (e.g., measured by level) in the spatial index has been reached. The maximum number of nodes may be determined based on the available processing and memory resources of the electronic device executing the application 190, selected to ensure substantially real-time operation (e.g., ending the loop when it would take "too long" to process more nodes). If the maximum number of nodes or maximum depth has been reached, execution proceeds to step 570, where a determination is again made whether there are remaining sibling nodes to process. If the maximum number of nodes or maximum depth has not been reached, execution proceeds to step 590, where a child node is selected and execution loops back to step 520.

Figure 6A:
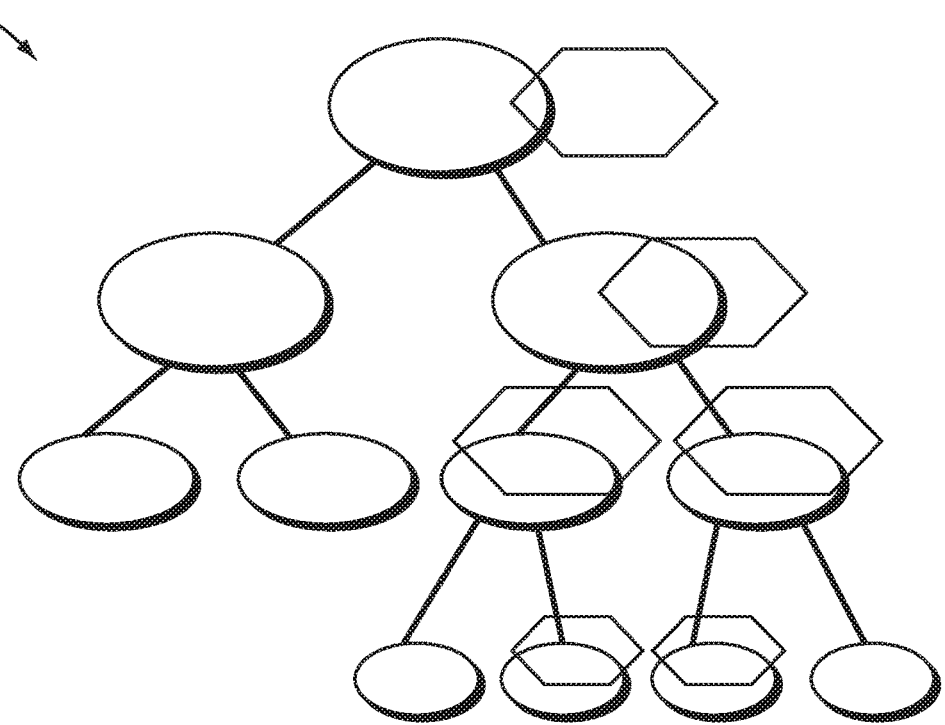
FIG. 6A is a diagram showing marking of a spatial index according to a traditional approach.
Figure 6B:
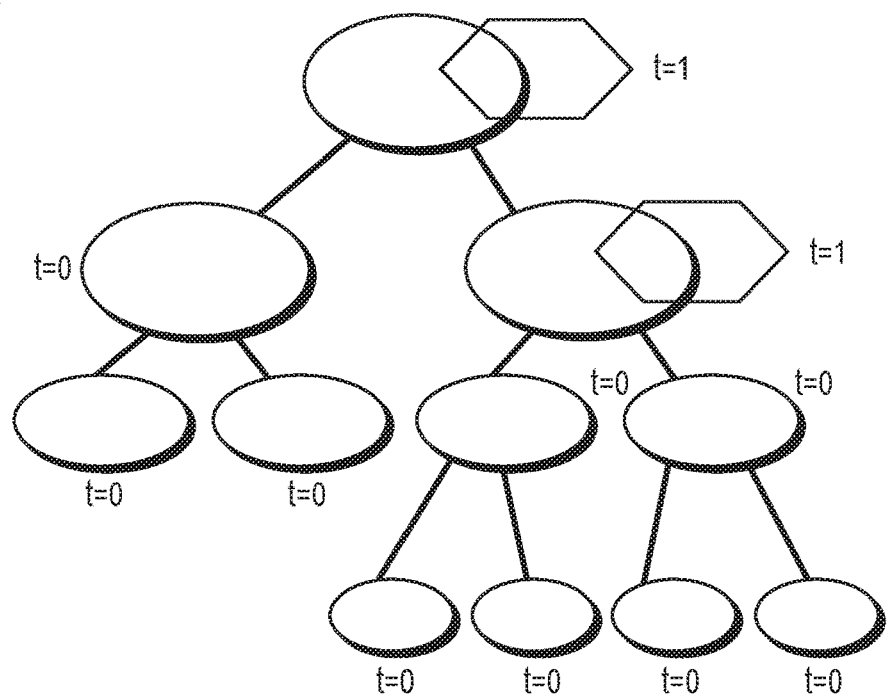
FIG. 6B is a diagram showing marking of a spatial index according to a new approach that imposes an upper bound on the number of operations performed, and uses timestamps.

The implication of imposing an upper bound on the number of operations performed may be illustrated by comparing the effects of the technique in FIG. 5 on a spatial index to the effects of a traditional technique. FIG. 6A is a diagram 600 showing marking of a spatial index according to a traditional approach. The clip geometry is symbolically represented as an octagon. As can be seen, according to the traditional approach, operations are performed to update the tag on six nodes on four different levels of the spatial index. FIG. 6B is a diagram 610 showing marking of a spatial index according to a new approach that imposes an upper bound on the number of operations performed and uses timestamps. Again, the clip geometry is symbolically represented as an octagon. As can be seen, according to the new approach, fewer operations are performed, with the tag only updated on two nodes at two levels in the time available up until the display needs to be refreshed. Operations are in intermediate (unfinished) state, where some nodes have not been reached in the time available.

Figure 7:
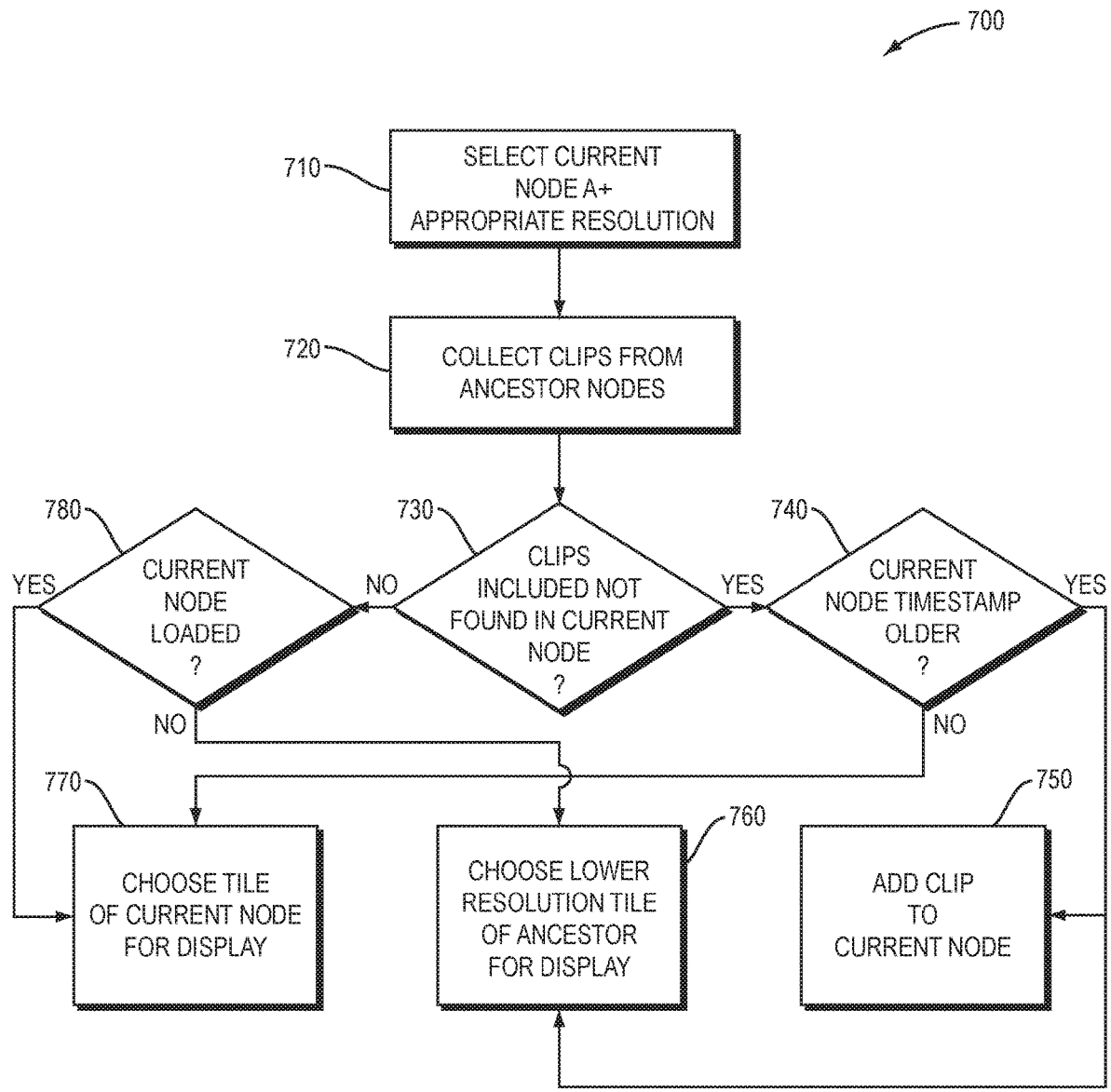
FIG. 7 is a flow diagram of a sequence of steps that may be performed by a drawing process of the editing, visualization and analysis application.

The drawing process may be adapted to direct which nodes are to be updated based on what is visible in the view, and to be able to produce a display while the spatial index in an intermediate (unfinished) state by leveraging information from lower resolution nodes. FIG. 7 is a flow diagram of a sequence of steps 700 that may be performed by a drawing process of the editing, visualization and analysis application 190. At step 710, a current node is selected corresponding to a tile required for a view of the multi-resolution textured mesh in the GUI at a given resolution. At step 720, clip geometry is collected from tags in ancestor nodes of the current node. At step 730, the drawing process determines whether any ancestor nodes include clip geometry not found in a tag of the current node. If an ancestor node includes a tag with clip geometry not found in a tag of the current node, execution proceeds to step 740, where a check is performed whether the current node has a timestamp that is older than the ancestor node's timestamp. Since the spatial index is in an intermediate (unfinished) state, the timestamp ensures that processed nodes can be distinguished from those yet to be processed for a change. If the current node has a timestamp that is older, execution proceeds to step 750, where processing is started to update the tag of the current node. In the interim, at step 760, a lower resolution tile that is available in the local cache corresponding to an ancestor node in the spatial index is chosen to be displayed. If the current node does not have a timestamp that is older, execution proceeds to step 770, where the tile of the current node is chosen to be displayed. Returning to step 730, if no ancestor nodes includes clip geometry beyond what is in the tag of the current node, execution proceeds to step 780, where it is determined whether the current node is available in the local cache. If so, execution proceeds to step 770, where the tile of the current node is chosen to be displayed. If not, execution proceeds to step 760, where a lower resolution tile corresponding to an ancestor node that is available in the local cache is chosen to be displayed.

It may be observed that the steps 700 of FIG. 7 effectively incorporate the task of choosing up-to-date information as part of steps that refresh the current display of the view of the multi-resolution textured mesh. As a result, something can still be shown on the screen while the full determination of all nodes affected by a change in the clip geometry is being made. Further, if there are more changes before the full determination is complete, the no longer-relevant clipping expires naturally. The technique scales independently of the volume of tiles affected by changes, such that substantially real-time refresh may still be provided even with large clip regions, very large meshes, and many levels of detail.

It should be understood that various adaptations and modifications may be readily made to what is described above, to suit various implementations and applications. While it is discussed above that many aspects of the techniques may be implemented in software (e.g., as executable instructions stored in a non-transitory electronic device readable medium for execution on one or more processors), it should be understood that some or all of the techniques may also be implemented in, or assisted by, hardware, for example, a GPU. A hardware implementation may include a variety of specially configured logic circuits and/or other types of hardware components. Above all, it should be understood that the above descriptions are meant to be taken only by way of example.

What is claimed is:

1. A method for clipping and displaying a multi-resolution mesh, comprising:
   updating, by an application executing on an electronic device, a spatial index for the multi-resolution mesh to an intermediate state of clipping, the spatial index having a plurality of nodes arranged in a tree corresponding to tiles of the multi-resolution mesh, the intermediate state including one or more nodes processed to include a tag describing how changed clip geometry applies to the node's corresponding tile, and one or more nodes yet to be processed for the changed clip geometry; and
   displaying, by the application, the multi-resolution mesh by selecting nodes, and for each selected node:
      determining whether an ancestor node includes a tag describing clip geometry not found in a tag of the selected node,
      if so, dispatching the selected node to be processed based on the clip geometry not found in the tag and temporarily displaying a lower resolution tile corresponding to the ancestor node, and
      if not, displaying the tile corresponding to the selected node.

2. The method of claim 1, wherein each node in the spatial index is given a timestamp that reflects when the node's tag was updated with clip geometry, and the determining is also based on whether the selected node has a timestamp older than the ancestor node.

3. The method of claim 1, wherein the ancestor node is a parent node.

4. The method of claim 1, wherein the updating further comprises:
   selecting a current node in the spatial index;
   determining the current node in the spatial index is affected by the changed clip geometry;
   updating the tag of the current node to describe how the changed clip geometry applies to the current node's corresponding tile;
   determining whether a predetermined maximum number of nodes has been reached;
   if so, only updating one or more sibling nodes of the current node; and
   if not, continuing updating one or more child nodes of the current node.

5. The method of claim 4, wherein the updating further comprises:
   adding a timestamp to the current node indicating when the current node was determined to be affected by the changed clip geometry.

6. The method of claim 4, wherein the predetermined maximum number of nodes is based on processing and/or memory resources of the electronic device.

7. The method of claim 1, wherein the multi-resolution mesh is a multi-resolution textured mesh that represents a portion of the physical environment, and the clipping is to accommodate computer aided design (CAD) objects representing planned infrastructure that are being combined with the multi-resolution textured mesh.

8. An electronic device comprising:
   a display screen;
   a processor; and
   a memory coupled to the processor and configured to store a multi-resolution mesh that is organized according to a spatial index having a plurality of nodes arranged as a tree corresponding to tiles of the multi-resolution mesh, and instructions for an application, the instructions executable on the processor and when executed operable to:
      update the spatial index for the multi-resolution mesh to an intermediate state, the intermediate state including one or more nodes processed to include a tag describing how changed clip geometry applies to the node's corresponding tile, and one or more nodes yet to be processed for the changed clip geometry, and
      display the multi-resolution mesh by selecting nodes, and for at least one selected node determining an ancestor node includes a tag describing clip geometry not found in a tag of the selected node, and in response thereto dispatching the at least one selected node to be processed based on the clip geometry not found in the tag and temporarily displaying a lower resolution tile corresponding to the ancestor node.

9. The electronic device of claim 8, wherein the instructions are further operable to:
for at least one other selected node determine the ancestor node does not include a tag describing clip geometry not found in a tag of the at least one other selected node, and display the tile corresponding to the at least one other selected node.

10. The electronic device of claim 8, wherein each node in the spatial index is given a timestamp that reflects when the node's tag was updated with clip geometry, and the determination is also based on whether the at least one selected node has a timestamp older than the ancestor node.

11. The electronic device of claim 8, wherein the ancestor node is a parent node.

12. The electronic device of claim 8, wherein the instructions to update further include instructions operable to:
select a current node in the spatial index;
determine the current node in the spatial index is affected by the changed clip geometry;
update the tag of the current node to describe how the changed clip geometry applies to the current node's corresponding tile;
determine whether a predetermined maximum number of nodes has been reached;
if so, only update one or more sibling nodes of the current node; and
if not, continue to update one or more child nodes of the current node.

13. The electronic device of claim 12, wherein the instructions to update further include instructions operable to:
add a timestamp to the current node indicating when the current node was determined to be affected by the changed clip geometry.

14. The electronic device of claim 12, wherein the predetermined maximum number of nodes is based on processing and/or memory resources of the electronic device.

15. The electronic device of claim 8, wherein the multi-resolution mesh is a multi-resolution textured mesh that represents a portion of the physical environment, and the clipping is to accommodate computer aided design (CAD) objects representing planned infrastructure that are being combined with the multi-resolution textured mesh.

16. A non-transitory electronic device readable media having instructions stored thereon that when executed on one or more processors are operable to:
update a spatial index for a multi-resolution mesh to an intermediate state of clipping, the spatial having a plurality of nodes arranged in a tree corresponding to tiles of the multi-resolution mesh, each node in the spatial index is given a timestamp that reflects when the node's tag was updated with clip geometry, and the intermediate state includes one or more nodes processed to include a tag describing how changed clip geometry applies to the node's corresponding tile, and one or more nodes yet to be processed for the changed clip geometry; and
display the multi-resolution mesh by selecting nodes, and for each selected node:
determine whether an ancestor node includes a tag describing clip geometry not found in a tag of the selected node and has a timestamp older than the ancestor node,
if so, dispatch the selected node to be processed based on the clip geometry not found in the tag and temporarily displaying a lower resolution tile corresponding to the ancestor node, and
if not, display the tile corresponding to the selected node.

17. The non-transitory electronic device readable media of claim 16, wherein the instructions when executed are further operable to:
select a current node in the spatial index;
determine the current node in the spatial index is affected by the changed clip geometry;
update the tag of the current node to describe how the changed clip geometry applies to the current node's corresponding tile;
determine whether a predetermined maximum number of nodes has been reached;
if so, only update one or more sibling nodes of the current node; and
if not, continue to update one or more child nodes of the current node.

18. A method for clipping and displaying a multi-resolution mesh, comprising:
updating, by an application executing on an electronic device, a spatial index for the multi-resolution mesh to an intermediate state of clipping, the spatial index having a plurality of nodes arranged in a tree, the intermediate state including one or more nodes processed for changed clip geometry, and one or more nodes yet to be processed for the changed clip geometry; and
displaying, by the application, the multi-resolution mesh by selecting nodes of the spatial index, and for one or more selected nodes:
determining that an ancestor node of the selected node was processed for changed clip geometry but the select node is yet to be processed for the changed clip geometry, and
in response to the determining, displaying a region of the multi-resolution mesh corresponding to the ancestor node.

19. The method of claim 18, wherein each node in the spatial index is associated with a respective time the respective node was last processed, and the determining also determines that the select node is associated with a time that is older than that of the ancestor node.

20. The method of claim 18, wherein the updating processes nodes in the spatial index for changed clip geometry until a predetermined maximum number of nodes has been reached and then stops, wherein the predetermined maximum number of nodes is based on at least in part on processing and/or memory resources of the electronic device.

* * * * *